United States Patent [19]

Abe et al.

[11] Patent Number: 5,371,679
[45] Date of Patent: Dec. 6, 1994

[54] VARIETY PRODUCT MANUFACTURING EQUIPMENT

[75] Inventors: Masashi Abe, Shimodate; Hidetoshi Matsushima; Takashi Tanaka, both of Shimotsuga; Yoshinori Noguchi, Utsunomiya; Kunio Ninomiya, Koga, all of Japan

[73] Assignee: Fujistu Limited, Kawasaki, Japan

[21] Appl. No.: 222,340

[22] Filed: Apr. 4, 1994

Related U.S. Application Data

[63] Continuation of Ser. No. 747,996, Aug. 21, 1991, abandoned.

[30] Foreign Application Priority Data

Aug. 21, 1990 [JP] Japan ................. 2-219612

[51] Int. Cl.$^5$ ............... G06F 15/46; B21D 39/03; B23P 21/00
[52] U.S. Cl. ............... 364/468; 364/474.11; 364/478; 29/429; 29/430; 29/771
[58] Field of Search ........... 364/468, 478, 474.11; 29/430, 33 P, 429, 720, 771, 787, 563, 568; 198/341, 349.7, 346.1; 414/222, 225, 227–265

[56] References Cited

U.S. PATENT DOCUMENTS

| | | | |
|---|---|---|---|
| Re. 33,862 | 3/1992 | Mori et al. ............... | 198/341 |
| 4,621,410 | 11/1986 | Williamson ............... | 364/468 |
| 4,698,766 | 10/1987 | Entwistle et al. ........ | 364/468 |
| 4,719,694 | 1/1988 | Herberich et al. ........ | 29/703 |
| 4,878,176 | 10/1989 | Tevahishi et al. ........ | 364/468 |
| 4,998,206 | 3/1991 | Jones et al. ............... | 364/468 |
| 5,062,195 | 11/1991 | Binder ....................... | 29/568 |
| 5,125,149 | 6/1992 | Inaba et al. ............... | 29/430 |
| 5,283,934 | 2/1994 | Zimpel et al. ............ | 29/33 P |
| 5,310,396 | 5/1994 | Momoi et al. ............ | 29/33 P |

FOREIGN PATENT DOCUMENTS

0302542 2/1989 European Pat. Off. .
WO86/07554 12/1996 WIPO .

*Primary Examiner*—Tan V. Mai
*Assistant Examiner*—Jim Trammell
*Attorney, Agent, or Firm*—Staas & Halsey

[57] ABSTRACT

A facility for manufacturing a variety of products laid out on a rectangular floor. The facility includes an entry warehouse located along one side of the floor and a product warehouse arranged so as to form an L-shaped layout with the entry warehouse. Parts assembly lines and dedicated product assembly lines are located, in the stated order, in a grouping which extends toward the product warehouse on the floor and such lines are partially enclosed by the entry warehouse and the product warehouse. The dedicated product assembly lines are functionally independent from each other, but the parts assembly lines cooperate with each other so as to produce articles that are commonly required by the dedicated product assembly lines. Transportation lines are incorporated in the facility to form an E-shaped flow pattern of the articles from the entry warehouse to the product warehouse.

15 Claims, 21 Drawing Sheets

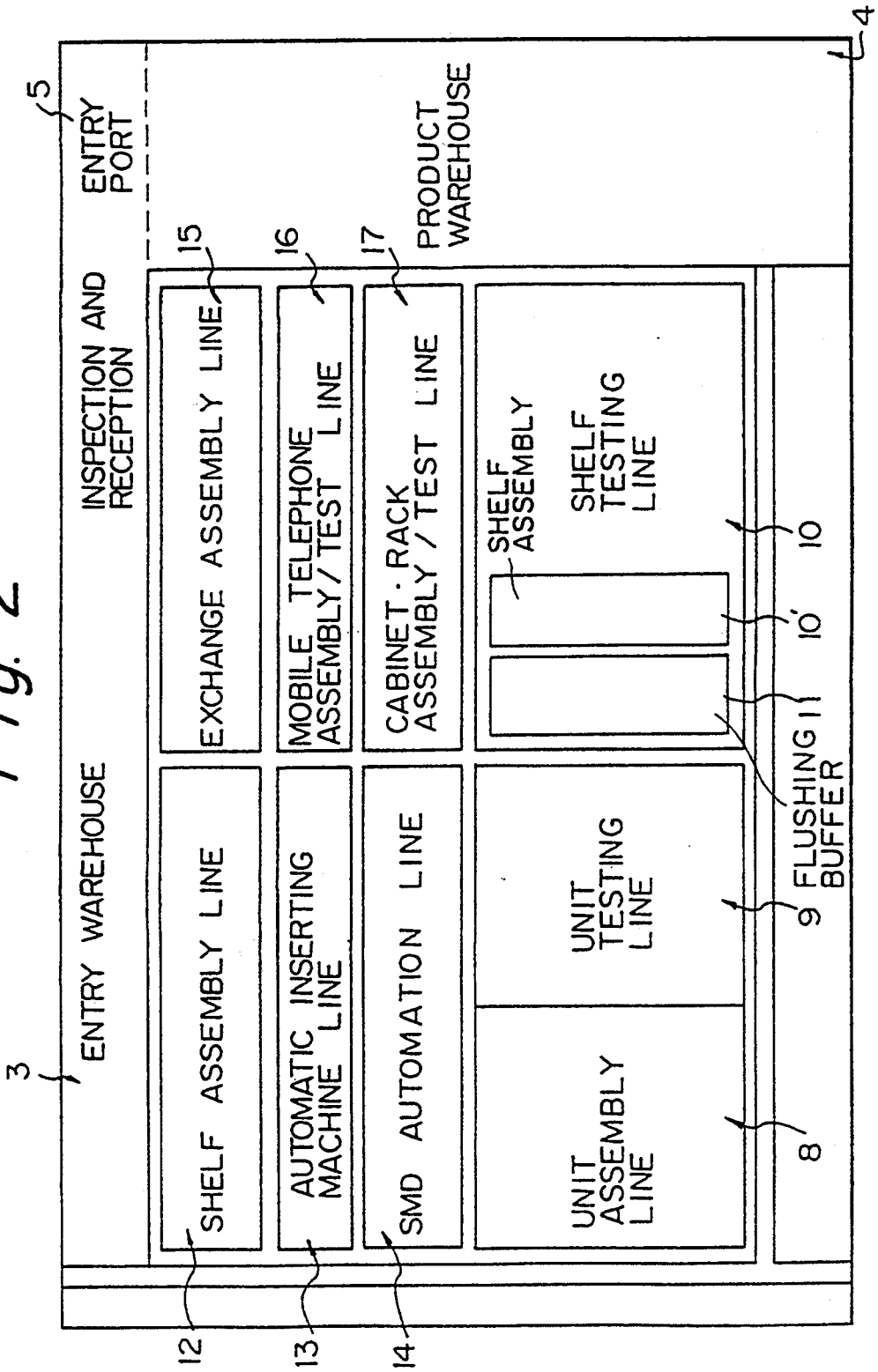

VARIETY PRODUCT MANUFACTURING EQUIPMENT

This application is a continuation, of application Ser. No. 07/747,996, filed Aug. 21, 1991, now abandoned.

BACKGROUND OF THE INVENTION

1. Field of the Invention

The present invention relates to manufacturing equipment for manufacturing a variety of completed articles and particularly to such equipment which includes a plurality of dedicated product assembly lines for assembling a variety of completed articles, parts assembly lines for assembling products commonly, an entry warehouse for storing received articles, and a product warehouse for storing completed articles. Preferably the manufacturing components are located on a floor which is substantially on the same plane and is substantially rectangular.

When performing a layout of the manufacturing lines to manufacture mass production products or particular products, the manufacturing lines should be laid-out in an arrangement that maximizes the work efficiency of the manufacturing process. However, in the case of manufacturing a variety of products, there has been no authorized guidelines.

2. Description of the Related Art

As mentioned above, when taking a layout of production lines into account, a suitable arrangement of the production line is a feature that should be given careful consideration. And it is preferable to conduct the flow of the articles through the manufacturing processes uniformly along the assembly lines from a parts assembly process to a completed article assembly stage.

According to the prior art, for example, in a factory for manufacturing products for light communication, each floor of a multifloor building is used. For example, the uppermost floor are used as an entry warehouse for receiving articles. Then, the necessary articles are assembled in lower floors and thus the flow of articles through the various processes is always directed sequentially from one floor to a lower floor.

As mentioned above, in the prior art, it is important to locate the manufacturing lines such that the flow of the articles through each manufacturing process is unidirectional. But the flow of the articles through each process is not always so. And, as mentioned above, in the case where each floor of a multifloor building is used, if a conflicting or reverse flow is inevitable, despite the planned flow of the articles, it is possible to cope with this by the use of, for example, an elevator. However, if it is intended to locate all manufacturing lines on a single floor, it is preferable to limit the occurrences of the above mentioned reverse flow to a minimum. Further, in view of a positional relationship between a factory site and a transportation facility, it is favorable to locate both the entry area for receiving articles and the exit area for completed articles in substantially the same position. In a case as stated above, a problem is how to share the necessary areas between an entry warehouse which stores the incoming parts and components and a product warehouse that stores the completed articles. Further, in some cases, an undesired conflict may occur between the flow of one article and the flow of another article.

SUMMARY OF THE INVENTION

Therefore, the present invention intends to provide a variety product manufacturing equipment that uses a large floor area and has as its object the efficient use of the substantially rectangular floor and the efficient flow of articles through the manufacturing process.

To attain the above object, the variety product manufacturing equipment of the present invention includes, on a rectangular floor, an entry warehouse located along one side of the floor, a product warehouse which is arranged to form an L-shaped layout with the entry warehouse, parts assembly lines and dedicated product assembly lines which are located, in this order toward the product warehouse on the floor and the same are partially enclosed by both the entry warehouse and the product warehouse. The dedicated product assembly lines are functionally independent from each other, but the parts assembly lines are cooperative with each other to produce articles commonly required by the dedicated product assembly lines. Further, transportation lines are incorporated in the layout so as to form an E-shaped flow, as a whole, of articles from the entry warehouse to the product warehouse.

BRIEF DESCRIPTION OF THE DRAWINGS

The above object and features of the present invention will be more apparent from the following description of the preferred embodiments with reference to the accompanying drawings, wherein:

FIG. 2 is a schematic plan view showing an arrangement of various lines used in the present invention;

DESCRIPTION OF THE PREFERRED EMBODIMENTS

The embodiments of the present invention will be described hereinbelow with reference to the related figures.

FIGS. 1A through 1F are schematic plan views for explaining the principles of the present invention. In the figures, 100 represents a floor, 1 a warehouse area (illustrated as an area with hatch marks extending from the top left to the bottom right in FIG. 1A), 2 a line equipment area (illustrated as an area with hatch marks extending from the top right to the bottom left), 3 an entry warehouse, 4 a product warehouse, 5 an entry port for the entry warehouse 4, 6 dedicated product assembly lines, 7 parts assembly lines, 8 a unit assembly line, 9 a unit testing line, 10 a shelf testing line and 11 a flushing buffer.

Figure 1A:
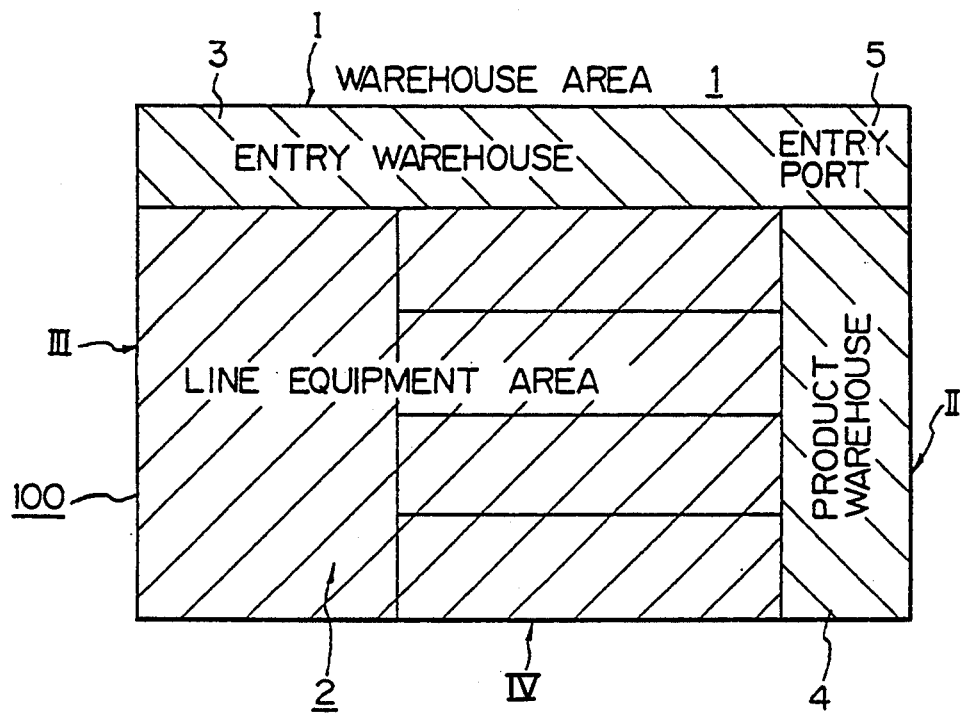
FIGS. 1A through 1F are schematic plan views for explaining the principles of the present invention.
Figure 1B:
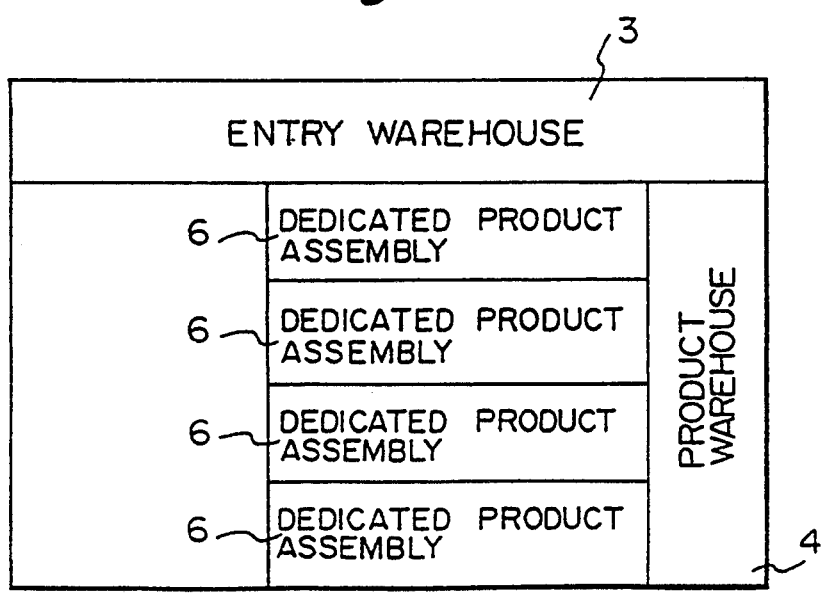

The rectangular floor 100 is sectioned into, as shown in FIG. 1A, the warehouse area 1 and the line equipment area 2. The warehouse area 1 is comprised of the entry warehouse 3 located along a first side I of the floor 100 and the product warehouse 4 located along a second side II of the floor 100. Further, the line equipment area 2 is sectioned into a plurality of dedicated product assembly lines 6 and parts assembly lines 7. The dedicated product assembly lines 6 are located adjacent to and parallel to the product warehouse 4, and the parts assembly lines 7 are located along a third side III of the floor 100 such that the lines 7 are adjacent to and as close as possible to the dedicated product assembly lines 6.

A plurality of the dedicated product assembly lines 6 are located so as to be able to receive a maximum amount of the parts from the entry warehouse 3. Further, the unit assembly line 8, the unit testing line 9 and the shelf testing line 10 are located in the stated order in a grouping which extends in the direction from the third side III of the floor 100 to the product warehouse 4 while utilizing both a part of the parts assembly lines 7 and a part of the dedicated product assembly lines in the line equipment area 2. At the entry port side of the shelf testing line 10, a flushing buffer 11 is mounted so as to wait for the required number of units and simultaneously conduct a shelf test.

In order to achieve an unmanned operation for the transfer of the articles as much as possible on the floor 100, conveyors and/or self-propelled carts are used. The conveyors and/or self-propelled carts are made to receive the following information, from a data processing unit (i) information for specifying a transfer unit used during a transfer of the articles, (ii) information for specifying an origin of transfer and (iii) information for specifying a destination of transfer.

The operation of the present invention is as follows.

Figure 1C:
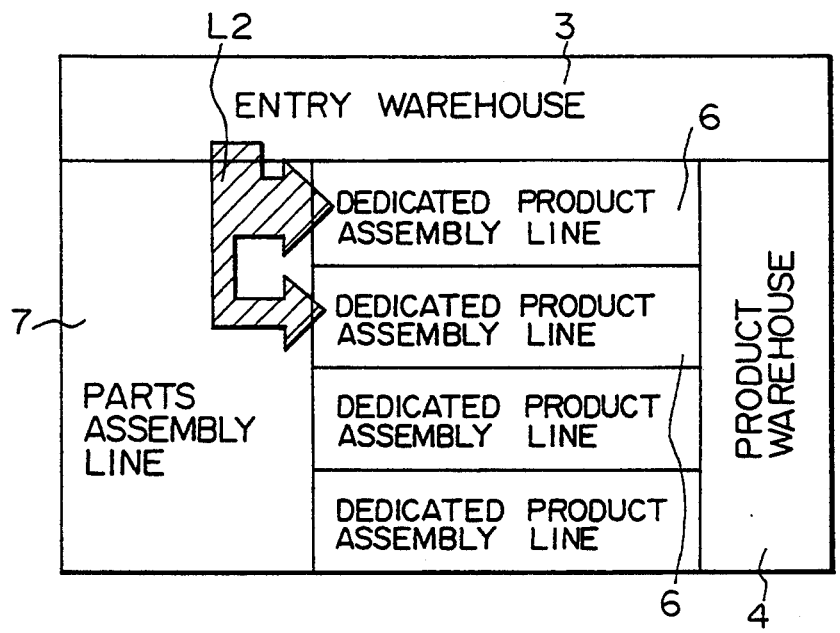

In the entry warehouse 3, articles such as parts materials that have entered from the entry port 5 shown in FIG. 1A are stored and the articles (parts materials) are supplied from the third side III of the floor 100 to the parts assembly lines 7, as shown in FIG. 1C. In the parts assembly lines 7, so-called common parts, such as parts loaded on a printed circuit board, are assembled and transferred to the dedicated product assembly lines 6. The products assembled at the dedicated product assembly lines 6 are stored in the product warehouse 4 and discharged outside. It should be understood that the entry port 5 of the entry warehouse 3 and the product warehouse 4 are located along this side (II) of the floor 100, since the road is located along the second side II of the floor.

Figure 1D:
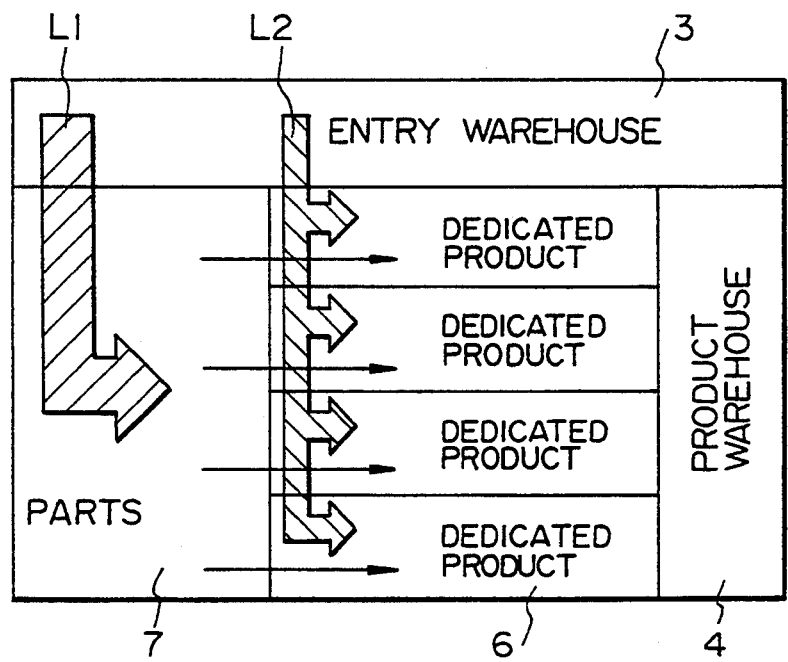

As seen from FIG. 1C, during the assembly of the parts into products, a flow of articles is created in a direction from the left to the right of the drawing. On the other hand, relatively large and heavy articles (parts materials) needed in the dedicated product assembly lines 6 are supplied (see L2), as shown in FIG. 1D directed from the center part of the entry warehouse 3 to each dedicated product assembly line. In this case, the dedicated product assembly lines that receive a larger number of articles (parts materials and heavy parts materials) are located closer to the entry warehouse 3 than the other dedicated product assembly lines.

The L-shaped warehouse area 1 (3 and 4) is located as shown in FIG. 1A, and in the present invention, the flow of the parts materials resembles, as a whole, an E-shape as depicted by arrows (L1, L2) in FIGS. 1C and 1D.

Figure 1E:
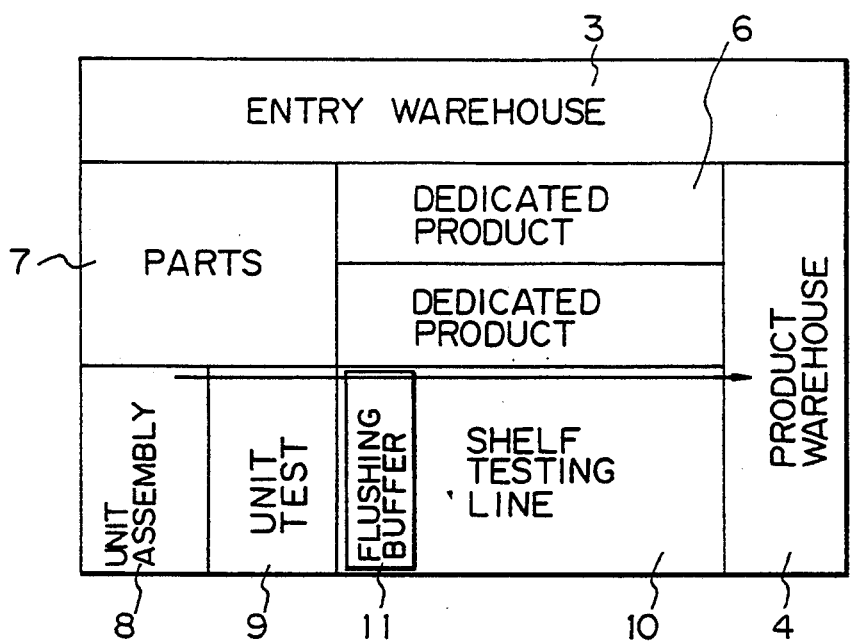
Figure 1F:
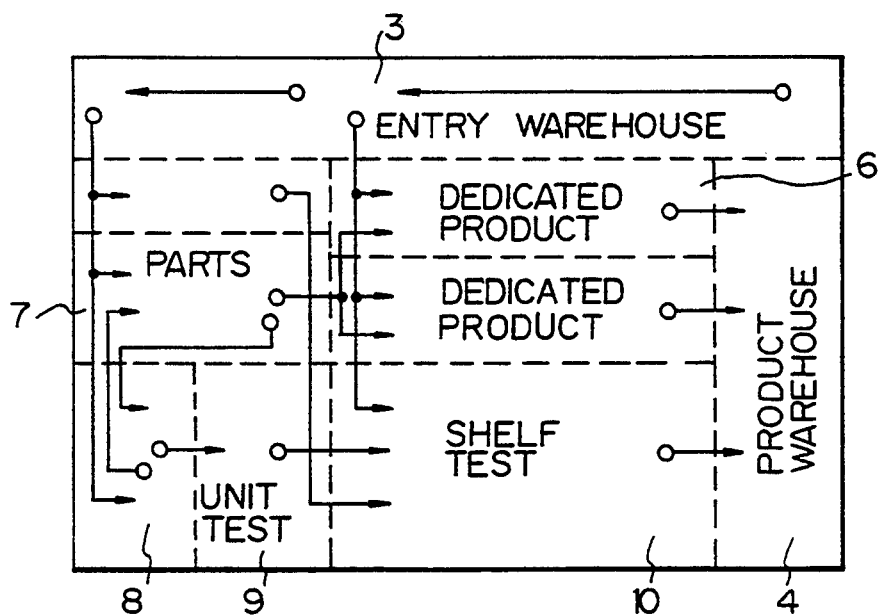

Further, in order to obey the design concept as much as possible, the articles should flow in a single direction as depicted in FIGS. 1C and 1D, and as shown in FIG. 1E, the unit assembly line 8, the unit testing line 9 and the shelf testing line 10 are arranged in a direction oriented from the third side III of the floor 100 to the product warehouse 4, in which line 10 the printed circuit board units are assembled into a shelf and then tested. Thus, the tested printed circuit boards are tested while being mounted on the shelf. Further, as shown by arrows, each starting from respective small circles in FIG. 1F, the articles are transferred by self-propelled carts and/or conveyors. Note that the self-propelled carts are vehicles that move, for example, along lines positioned on the floor while carrying the articles. The vehicles have an automatic function for loading the articles at specified post positions, moving and unloading the same at other specified post positions.

Here, the point of the present invention is summarized as follows. Namely, the variety product manufacturing equipment of the present invention comprises the entry warehouse 3 located on the rectangular floor 100 and extending along its first side I; the product warehouse 4 located on the floor 100 and extending along its second side II adjacent to said first side so as to form substantially an L-shaped warehouse, as a whole, with the entry warehouse 3; the line equipment area 2 located on the remaining part of the floor 100; the line equipment area 2 is formed with the parts assembly lines 7 and the dedicated product assembly lines 6, which parts assembly lines are located along the third side III, opposite to the second side II, of the floor, and the dedicated product assembly lines 6 are located between the parts assembly lines 7 and the product warehouse 4; and transportation means for carrying articles from the entry port 5 of the entry warehouse 3, which is located next to side II, to the product warehouse 4 through the parts assembly lines 7 and the dedicated product assembly lines 6, in the stated order, so as to form an E-shaped flow of articles, as a whole, the discharging completed articles from the product warehouse 4. The transportation means will be clear from FIGS. 7A to 7C.

FIG. 2 is a schematic plan view showing an arrangement of various lines used in the present invention. In the figure, reference numerals 3, 4, 5, 8, 9 and 10 correspond to those shown in FIGS. 1A to 1F, reference numeral 12 represents a shelf assembly line, 13 an automatic inserting machine line, 14 a surface mount device (SMD) automatic line, 15 an exchange assembly line, 16 a mobile telephone assembly/test line (note that it includes an assembly/test line for hand-held telephones), and 17 a cabinet.rack assembly/test line.

As the shelf assembly line 12, shelves for mounting units thereon are assembled. At the automatic inserting machine line 13, circuit elements having lead terminals are automatically inserted into the printed circuit board at its via holes. At the SMD automation line 14, the surface mounted devices are automatically loaded on the printed circuit board. The printed circuit boards passed through the automatic inserting machine line 13 and the SMD automation line 14 are transferred to the unit assembly line 8 and assembled to become units. Further, these printed circuit boards are also fed to the lines, such as the exchange assembly line 15 and the mobile telephone assembly/test line 16. At the exchange assembly 15, exchanges are assembled. At the mobile telephone assembly/test line 16, mobile telephone and hand-held telephones are assembled. At the cabinet.rack assembly/test line 17, cabinets and racks are assembled and then tested.

The unit assembly line 8 works to assemble units by using given printed circuit boards and the like. The unit testing line 9 works to achieve a test for the assembled units. At the shelf testing line 10, the units to be tested at this line 10 are mounted on the shelves at a shelf assembly part 10' of the shelf assembly line 12 and then tested. The thus completed shelves are, for example, data link communication apparatuses for subscribers.

Figure 3:
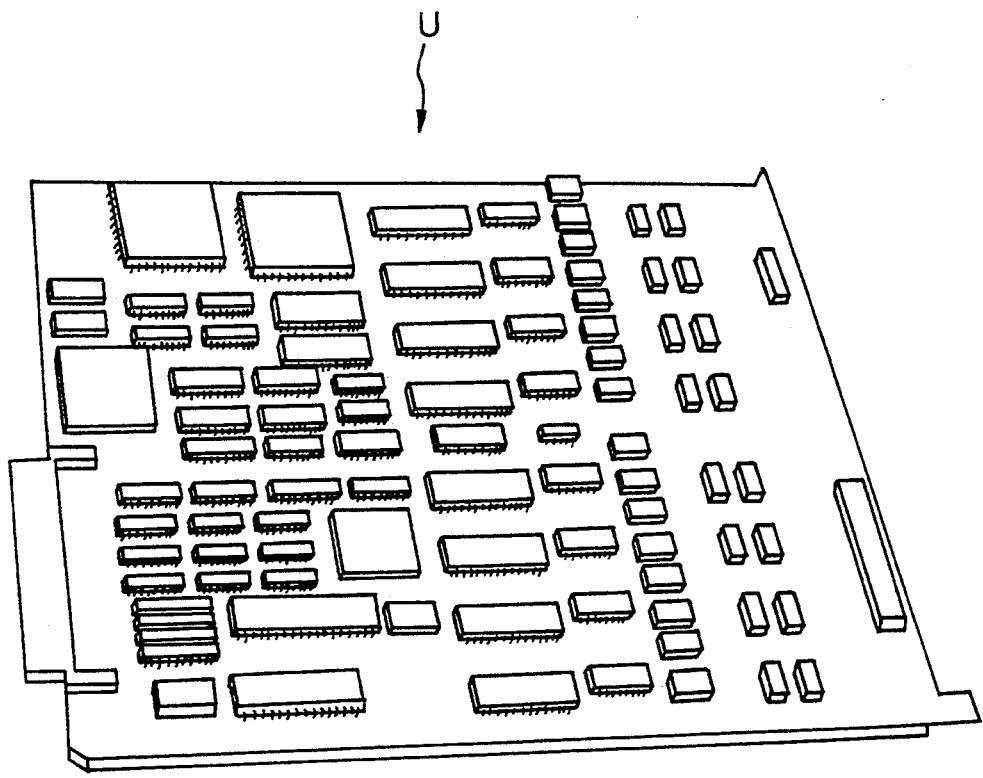
FIG. 3 is a perspective view showing an example of the unit layout.

FIG. 3 is a perspective view showing an example of the unit. The aforementioned units are completed by using the articles such as the printed circuit boards with IC's, resistors, capacitors and so on given from the lines 13 and 14 and also other articles given directly from the entry warehouse 3. In the figure, reference character U represent a unit.

Figure 4:
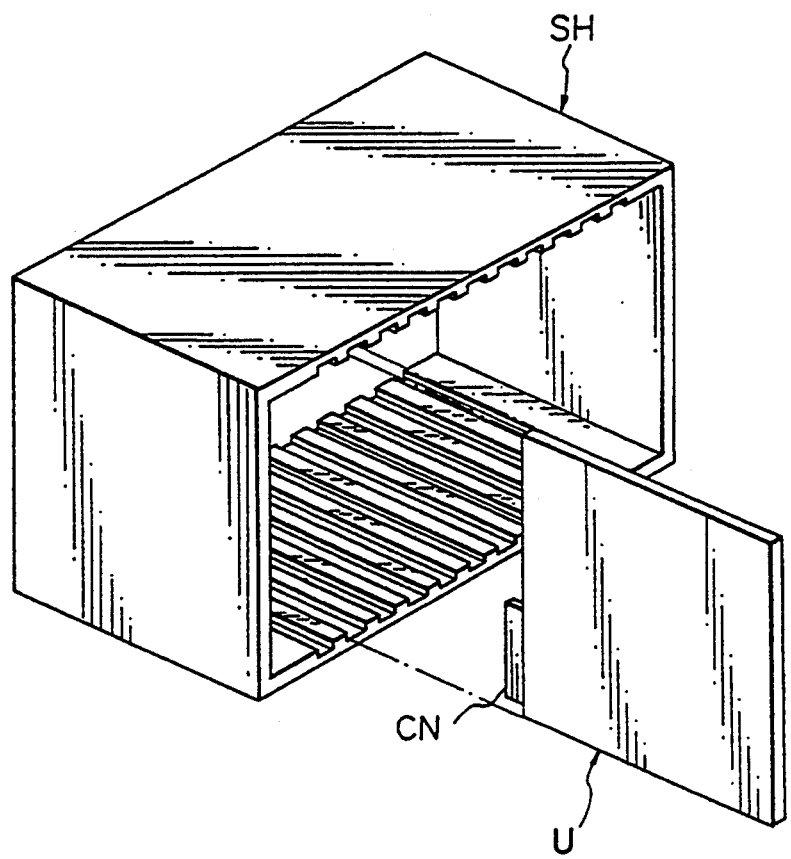
FIG. 4 is a perspective view showing an example of a shelf for use in connection with the invention.

FIG. 4 is a perspective view showing an example of the shelf. In the figure, reference character SH represents a complete shelf assembled at the shelf assembly line 12. The shelf SH is filled with a plurality of the units given from the unit testing line 9. In the figure, only one unit U is illustrated for brevity. The unit U is provided with a connector CN to be connected with a back board located at the rear side of the shelf SH, such back board having wiring lines.

Figure 5:
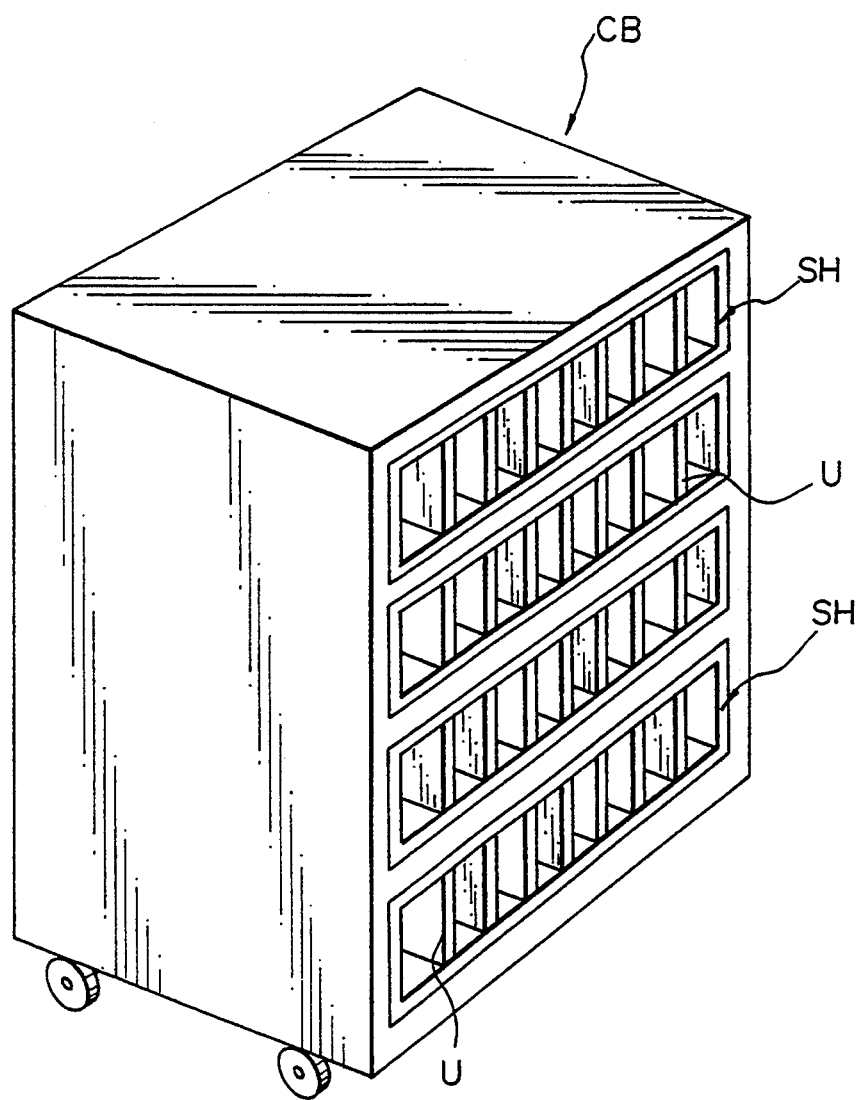
FIG. 5 is a perspective view showing an example of a cabinet for use in connection with the invention.

FIG. 5 is a perspective view showing an example of the cabinet. In the figure, reference character CB represents the cabinet. The assembled cabinet is box shaped and movable by bottom casters. In the figure, each of the shelves SH contains a plurality of the units U, and a plurality of shelves SH are contained in the cabinet CB.

Figure 6:
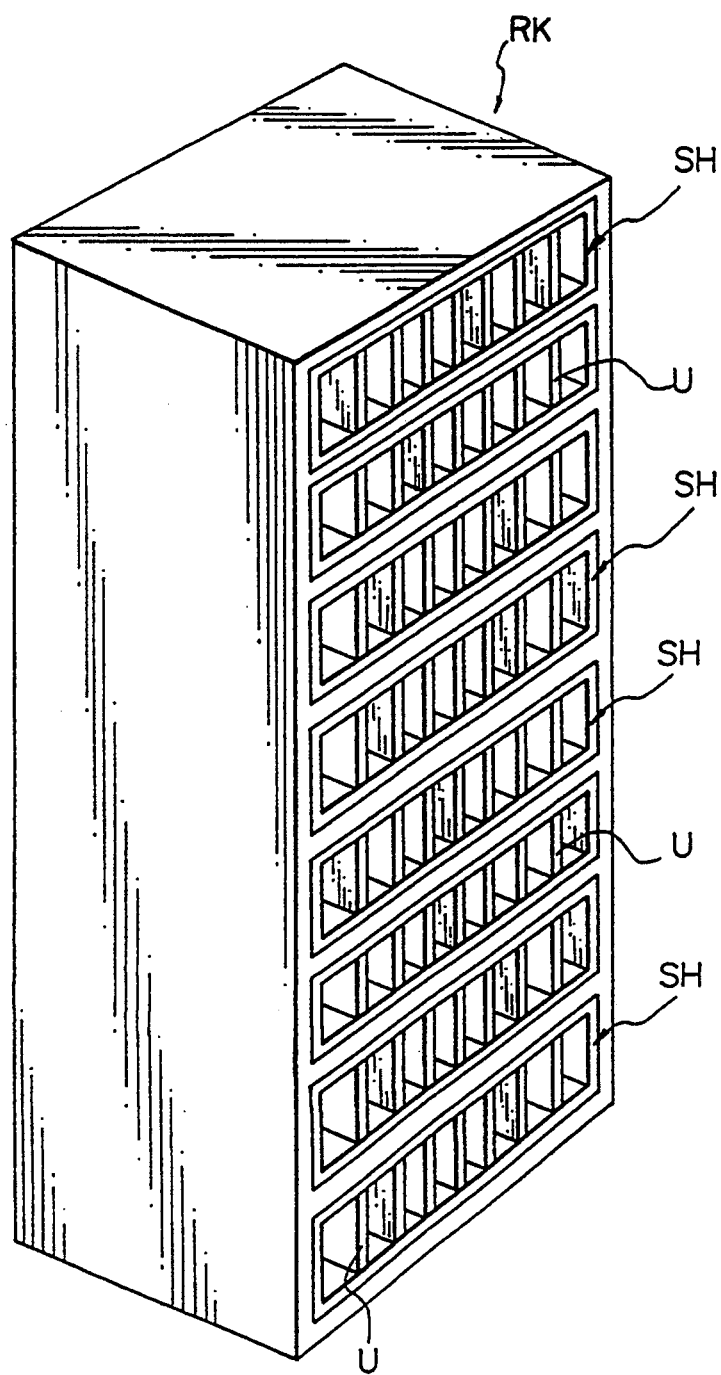
FIG. 6 is a perspective view showing an example of a rack for use in connection with the invention.

FIG. 6 is a perspective view showing an example of the rack. In the figure, reference character RK represents the rack. The rack RK is substantially identical to the cabinet. The difference is that the rack RK is not movable, but rather is fixed on a wall of a user's building. There are two types of racks RK, i.e., high rack and low rack.

Figure 7A:
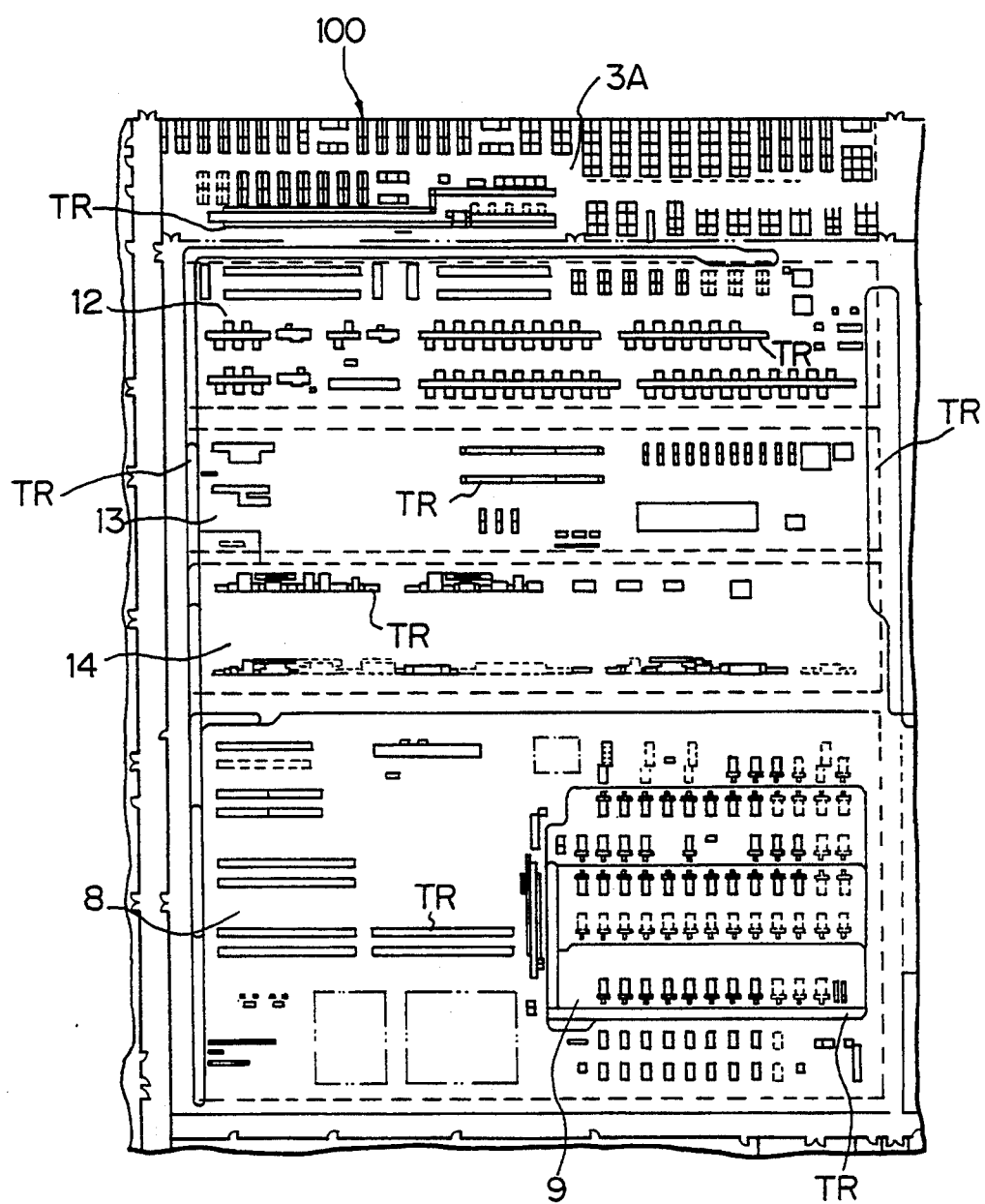
FIGS. 7A, 7B and 7C together present an actual plan view of the variety product manufacturing equipment layout according to the present invention.
Figure 7B:
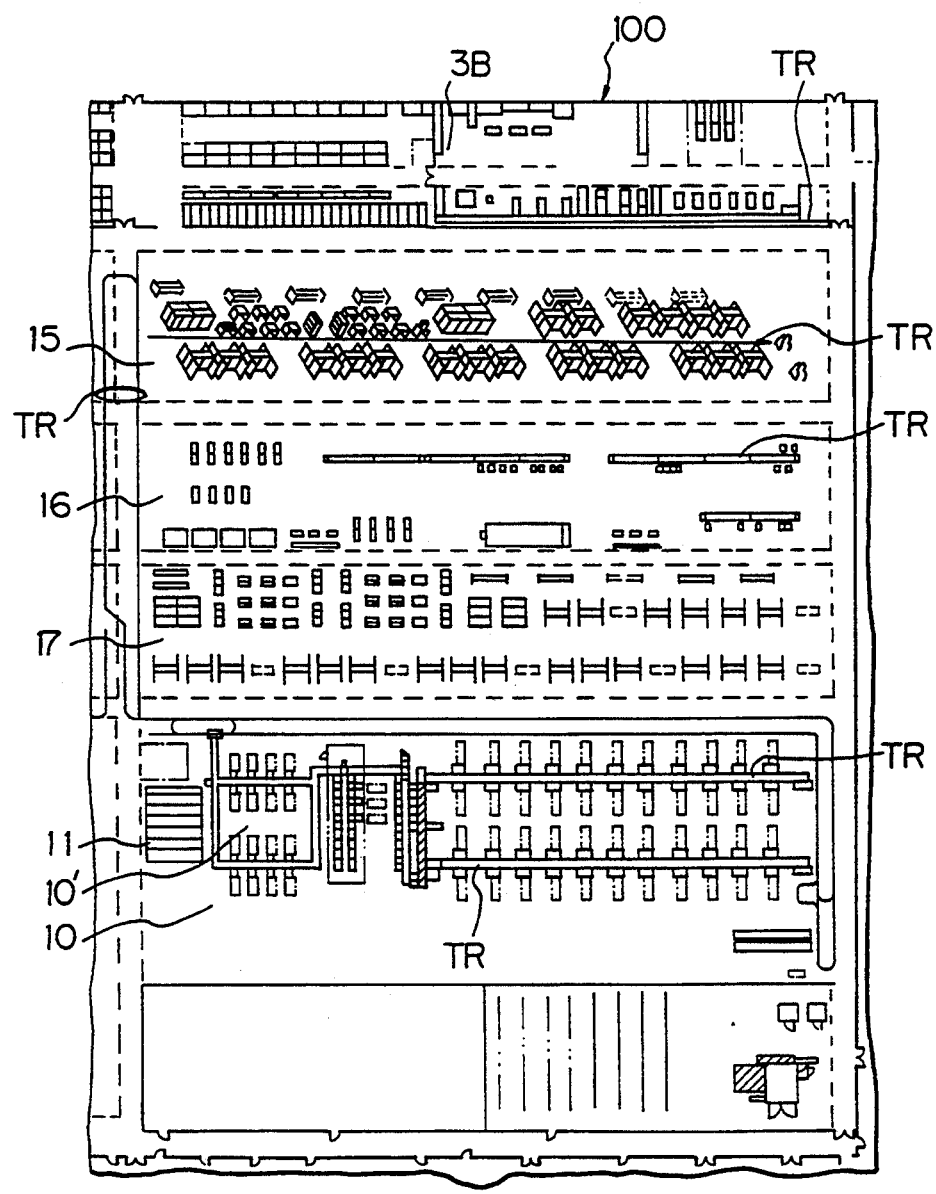
Figure 7C:
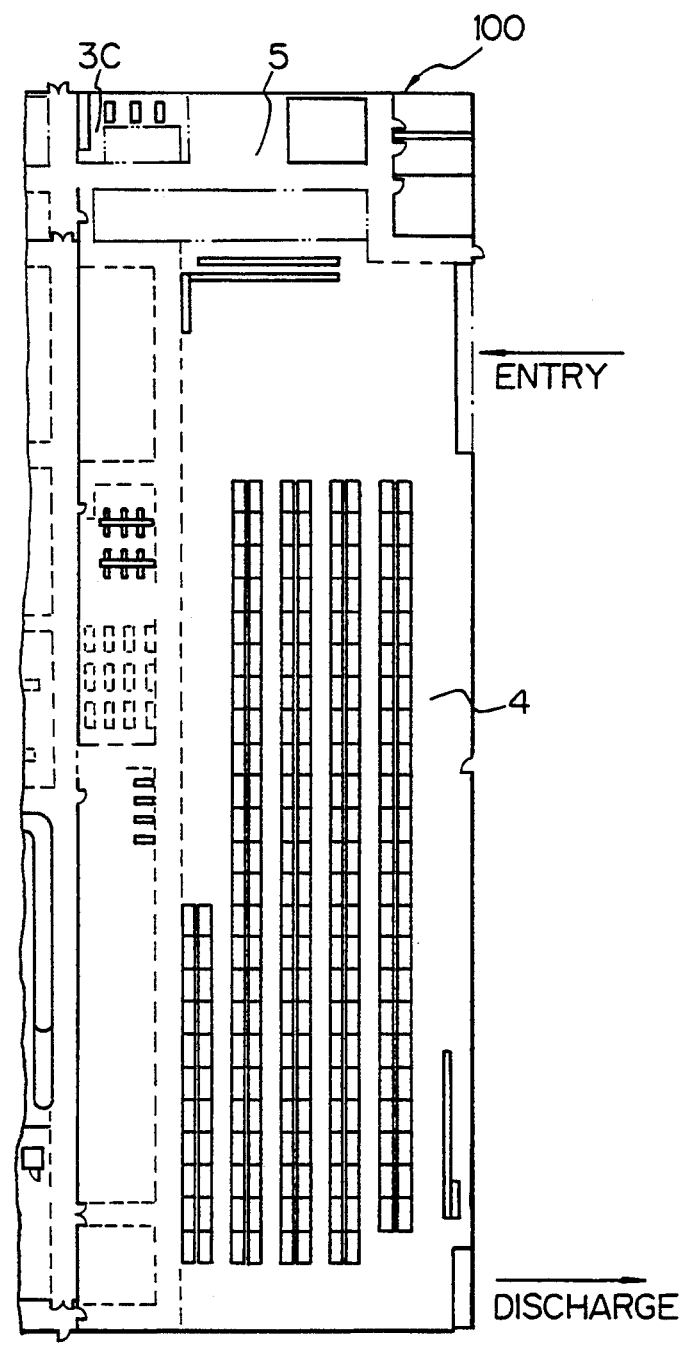

FIGS. 7A, 7B and 7C are segments of an actual plan view of the variety product manufacturing equipment according to the present invention, except for the exchange assembly line 15 which are shown in perspective. These FIGS. 7A, 7B and 7C are arranged from the left to right side by side to form a single unit of equipment. Further, portions identical to those explained before are indicated by the same reference numerals or characters. The aforesaid transportation means is indicated by the reference character TR. The transportation means TR includes a first transportation line along the third side III of the floor 100, which carries the articles from the entry warehouse 3 to the parts assembly line 7.

The transportation means further includes a second transportation line extending, between the parts assembly lines 7 and the dedicated product assembly lines 6, from the entry warehouse 3 to the fourth side IV opposite to the first side I of the floor 100 to carry the articles from said entry warehouse 3 to the dedicated product assembly lines 6.

The transportation means TR has conveyors and self-propelled carts, the conveyors are used for creating an E-shaped flow of the articles, while said self-propelled carts are used for carrying articles between each two lines which are not directly linked by the conveyors.

The conveyors and self-propelled carts are operated, as will be mentioned later, under control of a floor control system, a business system, i.e., a data processing system corresponding to a customer, a production management system, a CAD system, a warehouse management system handling entry and discharge management and a manufacturing management system for managing progress, quality control, etc., the above systems form a local area network (LAN) with all assembly lines.

FIGS. 8A through 8D are views showing a mode, as an example, of production line according to the present invention. In these figures, reference numerals 3, 4, 8, 9, 10, 11, 12, 13, 14, 15, 16 and 17 correspond to those shown in FIGS. 1A to 1E and/or FIG. 2, reference numeral 18 represents the self-propelled cart, 19 the conveyor, 20 a floor control system, 21 a local area network (LAN), 22 a business system, i.e., a data processing system corresponding to a customer, 23 a production management system, 24 a CAD system, 25 a warehouse management system handling entry and discharge management and 26 a manufacturing management system for managing progress, quality control, etc. The encircled numerals show the points of interconnection between the respective figures in FIGS. 8A through 8D. Thus, the arrow ① in FIG. 8A connects with the arrow ① in FIG. 8B, and so on.

The articles (parts materials) in the entry warehouse 3 are fed to the SMD automation line 14 and the automatic inserting machine line 13, thereby the printed circuit boards are manufactured. Further, required articles (parts materials) from the entry warehouse 3 are fed to the shelf assembly line 12.

The thus manufactured printed circuit boards and the like are guided to the unit assembly line 8 and assembled into units U. The assembled units are tested at the unit testing line 9 and momentarily stored in the flushing buffer 11. Further, the shelves assembled at the shelf assembly line 12 are also guided to the flushing buffer 11 by means of the self-propelled cart 18.

When the materials needed for assembling respective shelves are received at the flushing buffer 11, the necessary units are loaded on the shelf at the shelf testing line 10; the shelf loaded with the units is tested; thus the assembly, for, e.g., the aforesaid data link communication apparatus for subscribers, is completed and stored in the production warehouse 4.

At the cabinet.rack assembly/test line (17-1 and 17-2), the necessary articles are received mainly from the entry warehouse 3 to assemble the cabinet or the rack. The assembly is then tested and stored in the product warehouse 4.

Further, the mobile telephone assembly/test line 16 receives necessary materials from the entry warehouse 3 and the automatic inserting machine line 13 and/or the SMD automation line 14 to assemble telephones and then test the same and store them in the product warehouse 4.

Figure 8A:
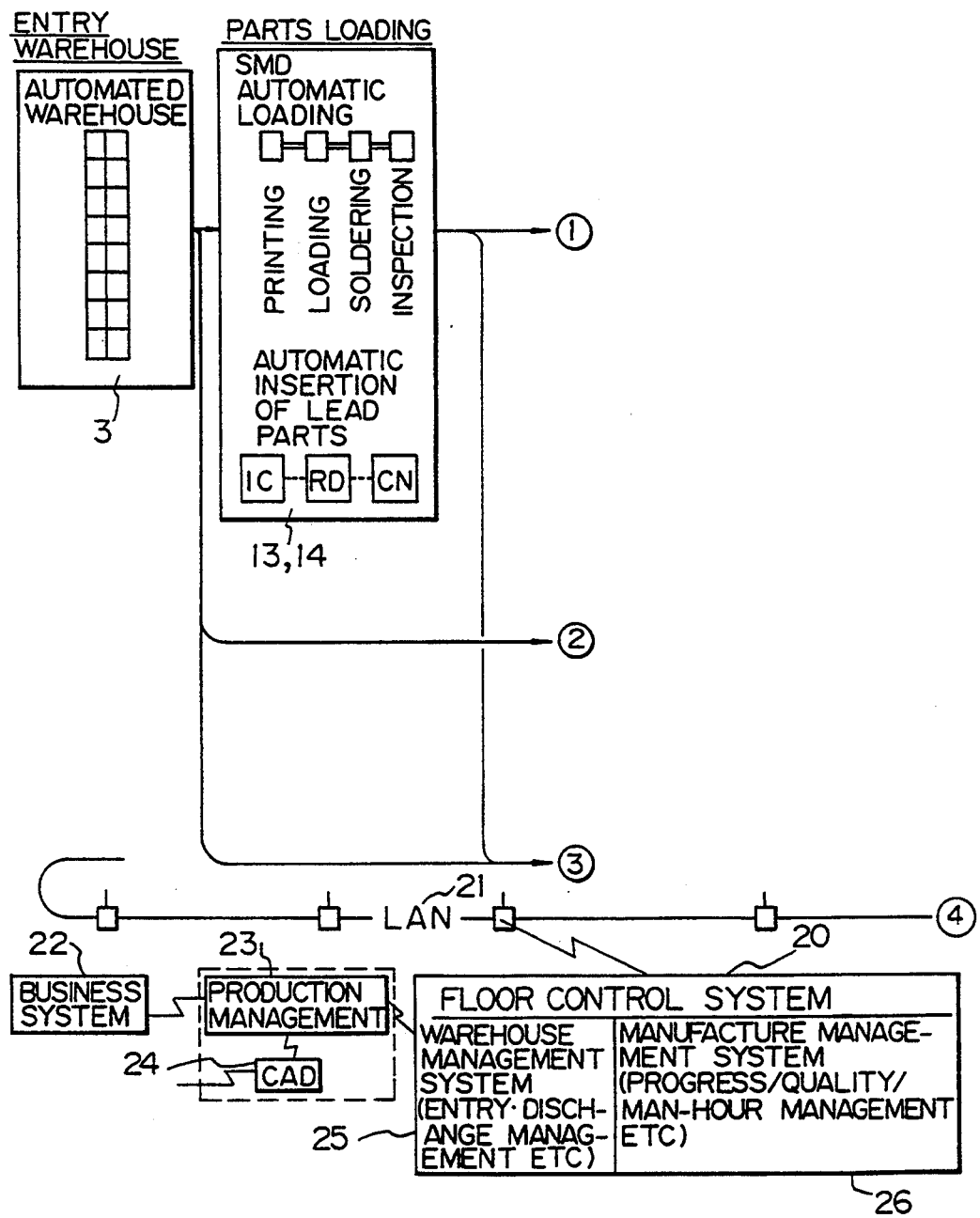
FIGS. 8A through 8D are plan views showing a mode, as an example, of a production line layout according to the present invention.

Regarding the above-mentioned production lines shown in FIGS. 8A through 8D, the floor control system 20 shown at the bottom left portion of FIG. 8A issues instructions to each line and controls overall lines by cooperating with the warehouse management system 25 and the manufacturing management system 26 via the LAN 21. The warehouse management system 25 and the manufacturing management system 26 communicate with the production management system 23 operated in connection with the business system 22 and the computer-aided design (CAD) system 26, thereby performing warehouse and manufacturing management.

One of the layout design concepts of the present invention is to improve both the efficiency and the quality of the manufacturing process.

In the block (13, 14), RD denotes radial parts such as resistors and capacitors, and CN denotes connectors. In the block 10, BURN-IN denotes a constant temperature oven for testing. In the block 19, CARRIER denotes a cart for mounting and carrying the high rack in a lying state. In the block 16, Tu denotes a hand set of the mobile telephone and Cu denotes a base part of the mobile telephone, and "HAND-HELD" denotes a hand-held radio telephone.

Figure 9:
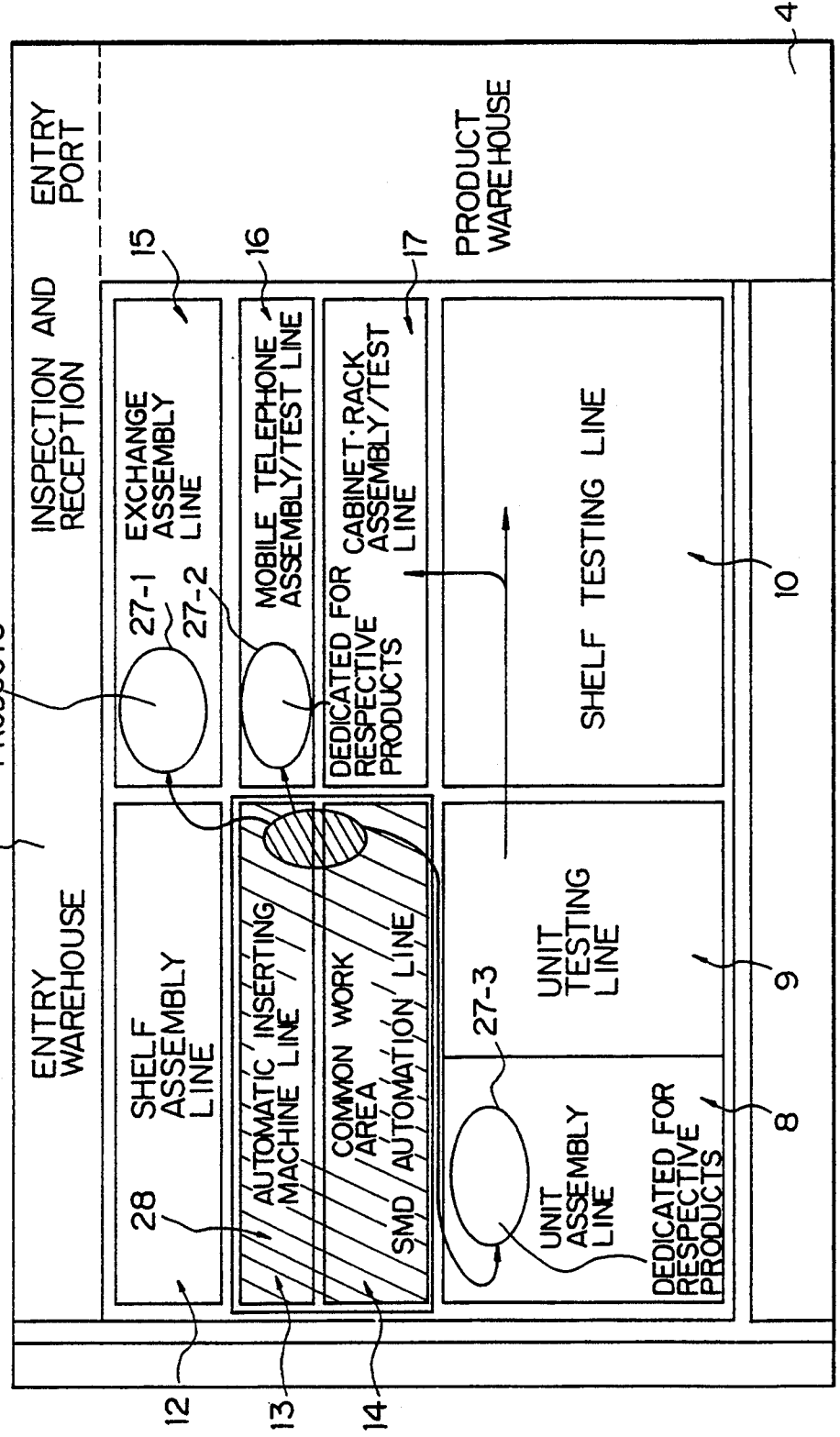
FIG. 9 is a schematic view for explaining one of the concepts of the present invention.

FIG. 9 is a schematic view for explaining one of the concepts of the present invention. Namely, according to the present invention, the dedicated product assembly lines 6 are constructed such that their respective functions are independent from each other, but the parts assembly lines 7 are constructed such that respective functions can be cooperative with each other to produce articles commonly required by the dedicated assembly lines 6.

In FIG. 9, reference numerals 3, 4, 8, 9, 10, 13, 14, 15 and 16 correspond to those shown in FIG. 2. Each of the dedicated product assembly lines for respective types of products 27-i (i=1, 2, 3), such as the exchange assembly line 15, the mobile telephone assembly/test line 16, the unit assembly line 8 for obtaining the aforesaid data link communication apparatus for subscribers and so on, are designed to use the printed circuit boards and so on which have been assembled at a common work area 28 (illustrated in FIG. 1A as area with hatch marks extending from top right to bottom left).

In the prior art, generally, the SMD automation line for exchange, the SMD automation line for mobile telephone and the SMD automation line for aforesaid data link communication apparatus for subscribers exist separately. In the present invention, however, the printed circuit boards and the like are made in common as much as possible, and thereby works can be made in common. By this, it is expected to improve the quality and efficiency.

Figure 8B:
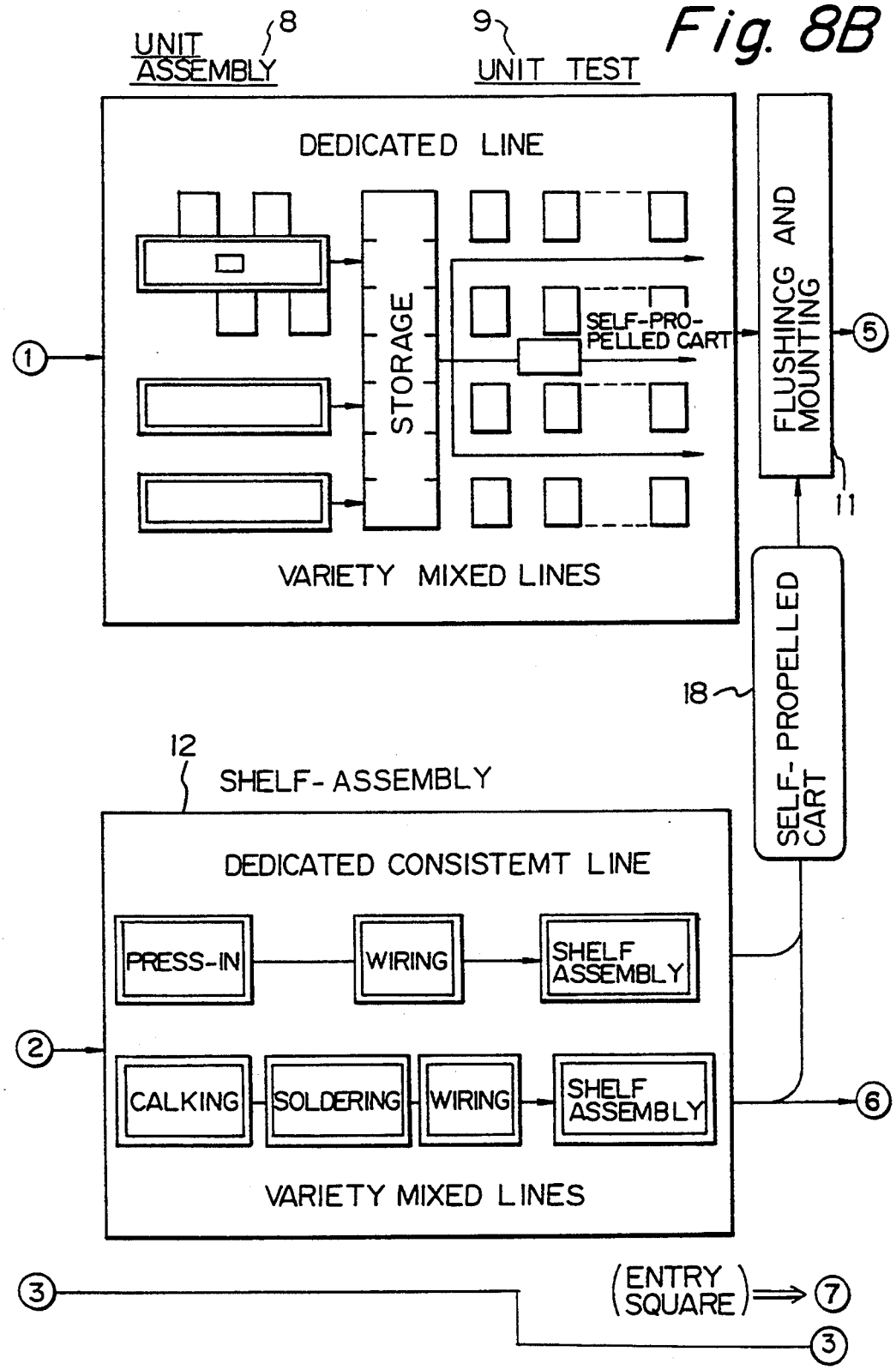
Figure 8C:
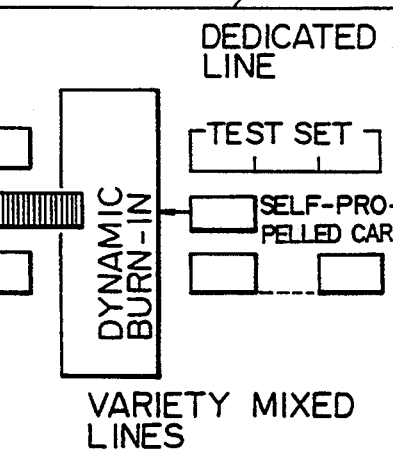
Figure 8D:
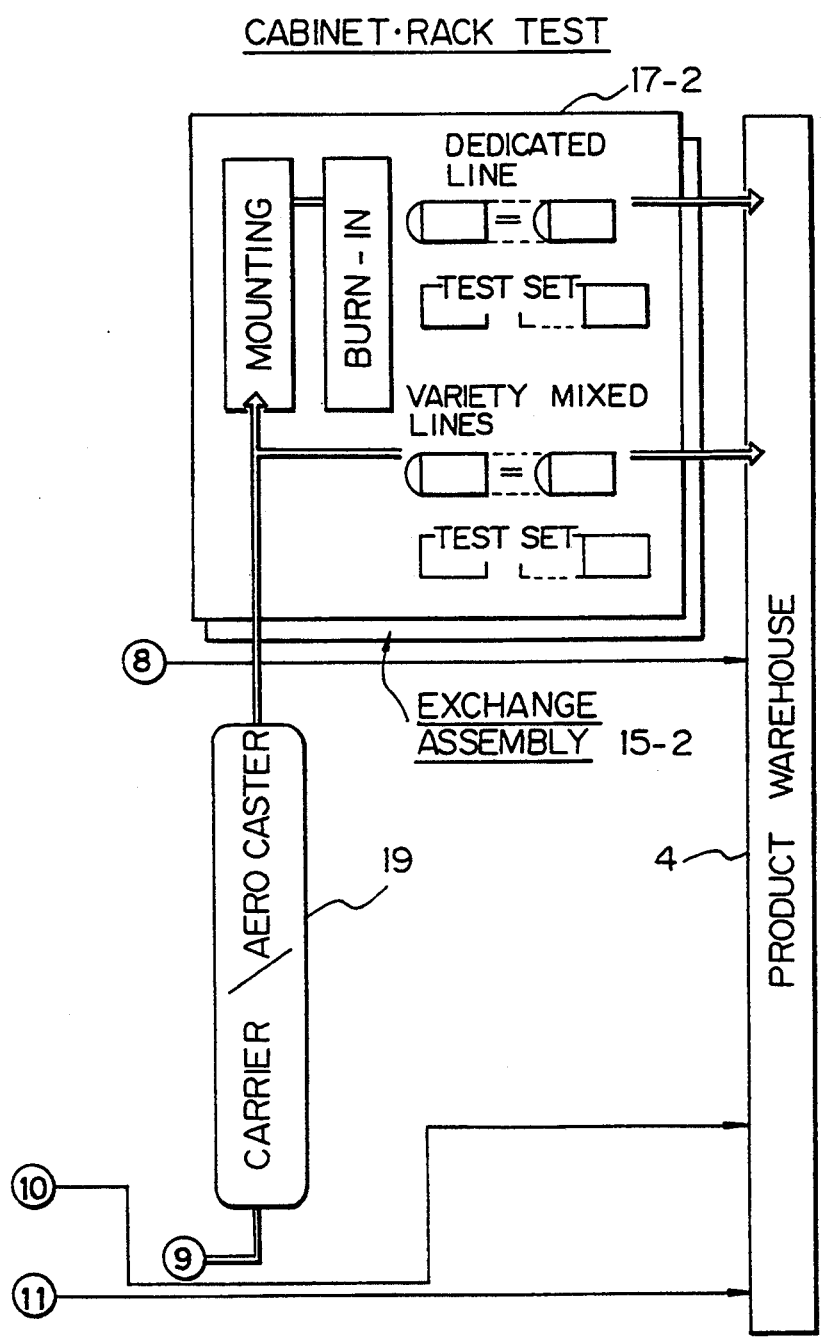

Other than the aforesaid common application of both the common work area 28 and the dedicated line for the production of respective products 27-i, the dedicated product lines and mixed lines for a variety of products are arranged in common (8, 12, 17-1, 17-2), as shown in FIGS. 8B, 8C and 8D by the unit assembly line 8, the shelf assembly line 12 and the cabinet.rack assembly/test line 17.

Figure 10:
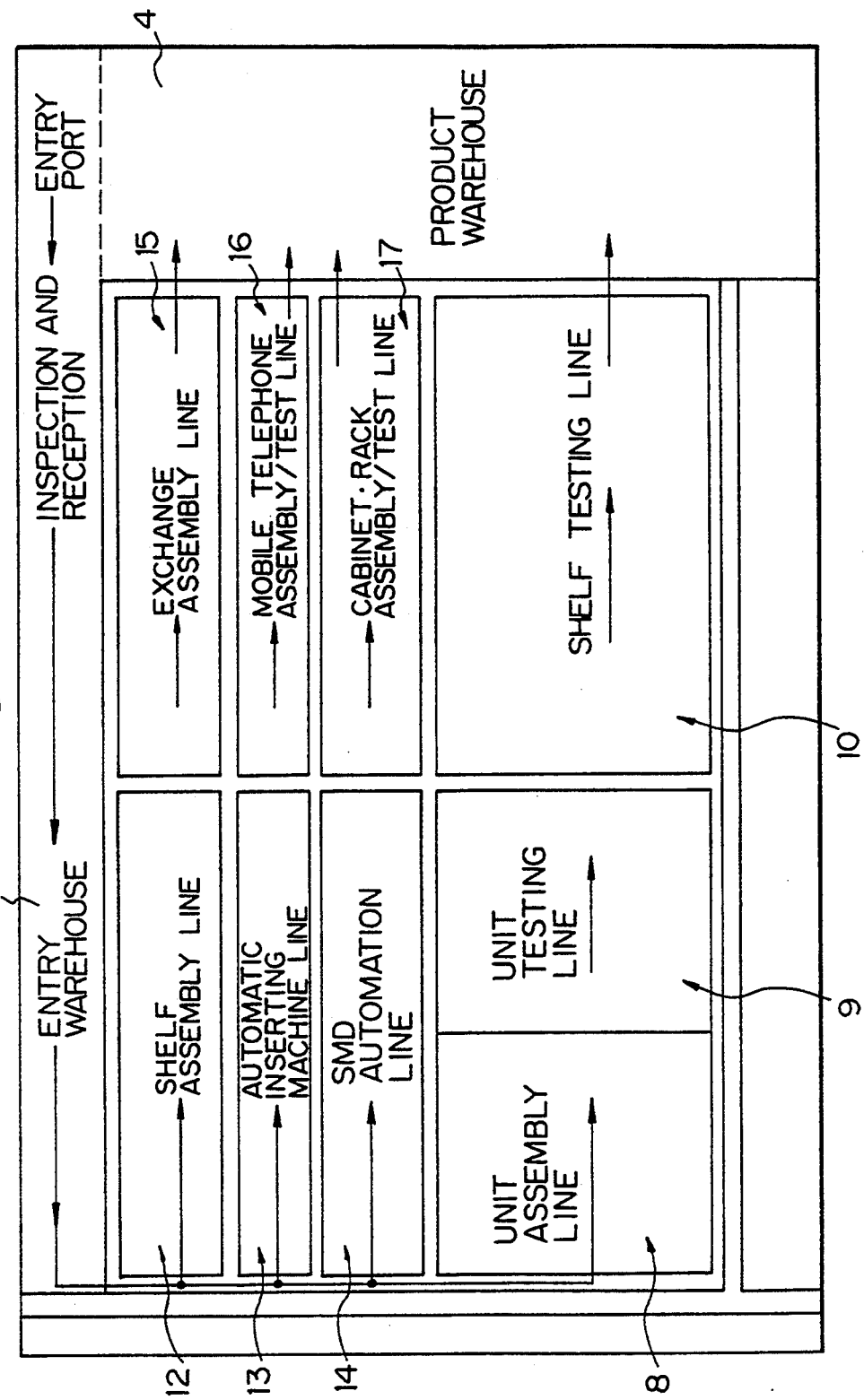
FIG. 10 is a schematic view explaining how work management is facilitated in accordance with the invention.

FIG. 10 is a view explaining that work management is made easy. In this figure, reference numerals 3, 4, 8, 9, 10, 12, 13, 14, 15, 16 and 17 correspond to those shown in FIG. 2. The materials for production are received in the entry warehouse 3 and then transferred along E-shaped routes, as a whole, as shown by arrows in FIG. 10. Namely, along an assembly sequentially from light weight and small size materials, the materials are transferred whereby the flow of articles and the flow of lines are oriented, as a whole, toward the product warehouse 4 as uniformly as possible.

Figure 11:
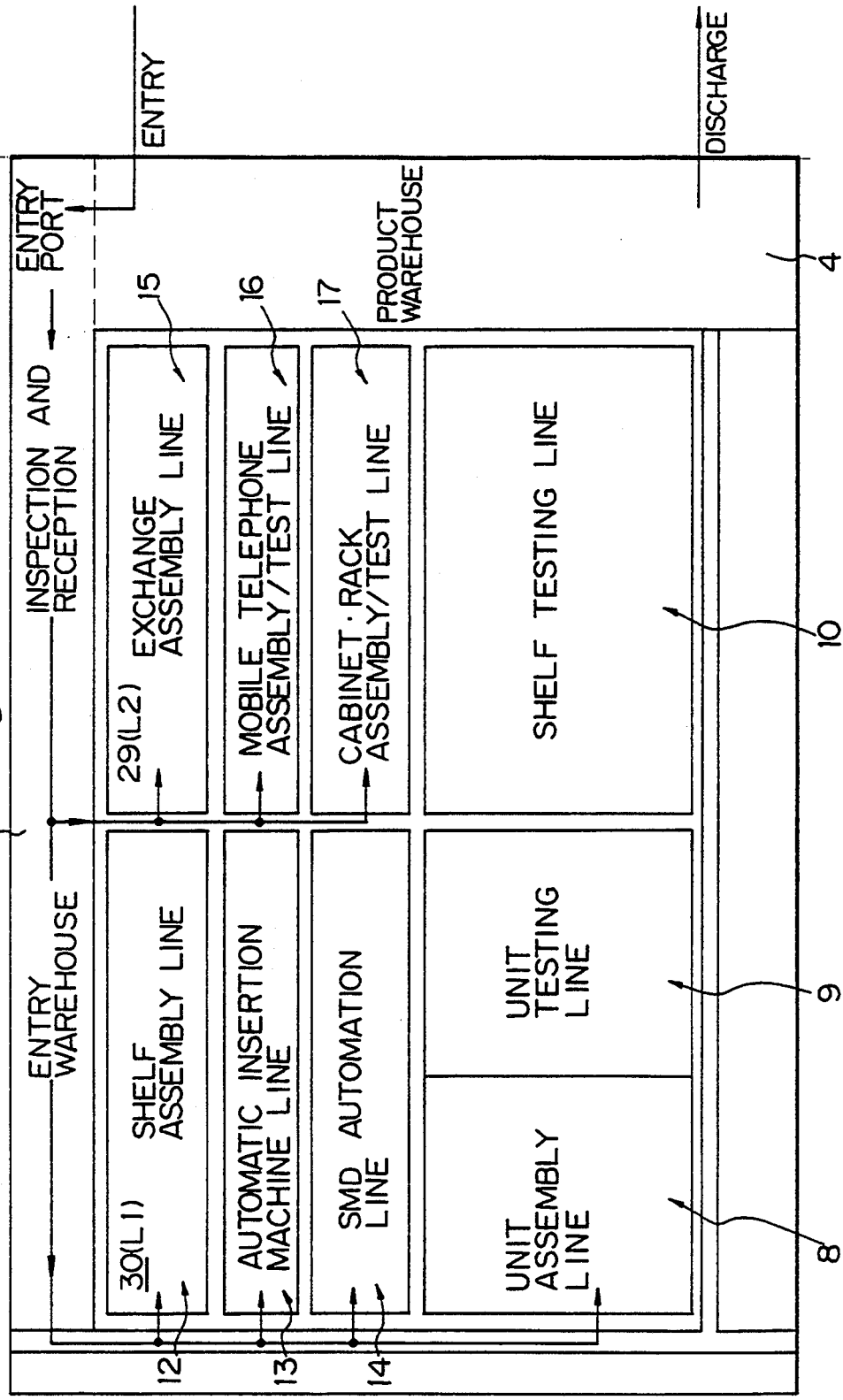
FIG. 11 is a schematic view for explaining how the transportation of materials is made more efficient in accordance with the invention.

FIG. 11 is a view for explaining that the transportation of materials is efficient. In this figure, reference numerals 3, 4, 8, 9, 10, 12, 13, 14, 15, 16 and 17 correspond to those shown in FIG. 2. As already explained with reference to FIG. 10, the materials are transferred, as a whole, along E-shaped routes so as to make the work management easy. However, in the production using the exchange assembly line 15, the mobile telephone assembly/test line 16 and the cabinet.rack assembly/test line 17 as shown in FIG. 11, heavy weight materials and large size structures are needed. To cope with this, in the present invention, a center feed route is prepared to feed the aforesaid heavy weight materials and large size structures from the center of the entry warehouse 3 extending from the left to the right in the figure, to the aforesaid lines 15, 16 and 17, directly.

An arrow 29 in the figure represents the center feed route (L2) and other arrows connected thereto represent parts materials feed routes. Namely, in the present invention, as understood from a configuration of the arrows 29 and 30 shown in FIG. 11, duplex L-shaped material transportation modes (L1, L2) are given, and thereby a transportation amount and a transportation distance of the heavy weight materials and the large size structures are reduced. Incidentally, the exchange assembly line 15 is fed, along the arrow 29, with relatively heavy weight and large size materials (e.g. 20 to 30 kg; $0.6 \times 0.6 \times 0.3$ m). The mobile telephone assembly/test line 16 is fed, along the arrow 29, with mass production articles (e.g. 10,000 units/day; 200 cases/day). The cabinet.rack assembly/test line 17 is fed, along the arrow 29, with heavy weight and large size materials (e.g. 0.8 to 1.5 t/unit; $2 \times 1 \times 1.5$ m). Note that the materials to be fed, along the arrow 29 to the cabinet.rack assembly/test line 17 are heavier and larger than those to be fed to the exchange assembly line 15 and the mobile telephone assembly/test line 16, but, the total amount of the former is less than that of the latter. Namely, the greater the amount of the materials fed, the closer the corresponding line is located to the entry warehouse 3.

Further, the materials to be fed, along an arrow 30 shown in the figure, are relatively light weight and small size materials, however, relatively heavy weight and large size materials (e.g. 1.5 to 20 kg; $0.6 \times 0.6 \times 3$ m) are fed to the shelf assembly line 12 shown in FIG. 11.

Figure 12:
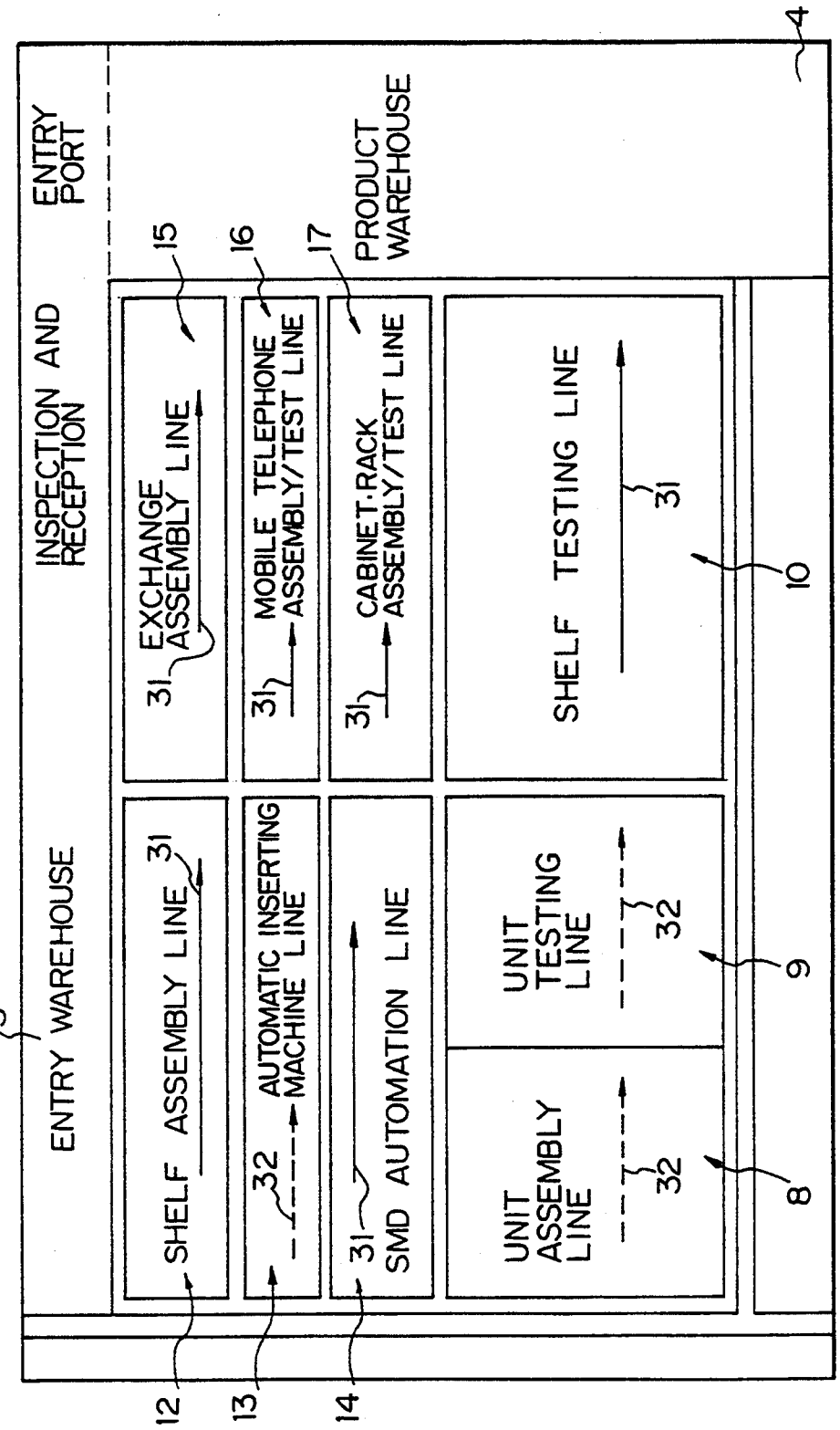
FIG. 12 is a schematic view for explaining how the quantity of goods in process can be reduced in accordance with the invention.

FIG. 12 is a view for explaining that the goods in process can be reduced. In this figure, reference materials 3, 4, 8, 9, 10, 12, 13, 14, 15, 16 and 17 correspond to those shown in FIG. 2. In FIG. 12, the solid line arrow 31 represents one piece delivery (i.e., articles are sent individually to the next stage processing portion), the broken line arrow 32 represents one rack flow (i.e., articles are put into the rack, namely private boxes and then the racks are sent individually to the next stage processing portion).

In the present invention, at each line, note is taken to minimize an accumulation of goods in process at respective lines and at each stage and adapt, as much as possible, the one piece flow (31) and one rack flow (32) system is necessary, whereby, at each stage, it becomes possible to start work immediately upon receipt of the article.

Further, in order to avoid, as much as possible, the above accumulation, the above stages are arranged in order of the working processes corresponding to the amount of work.

Figure 13:
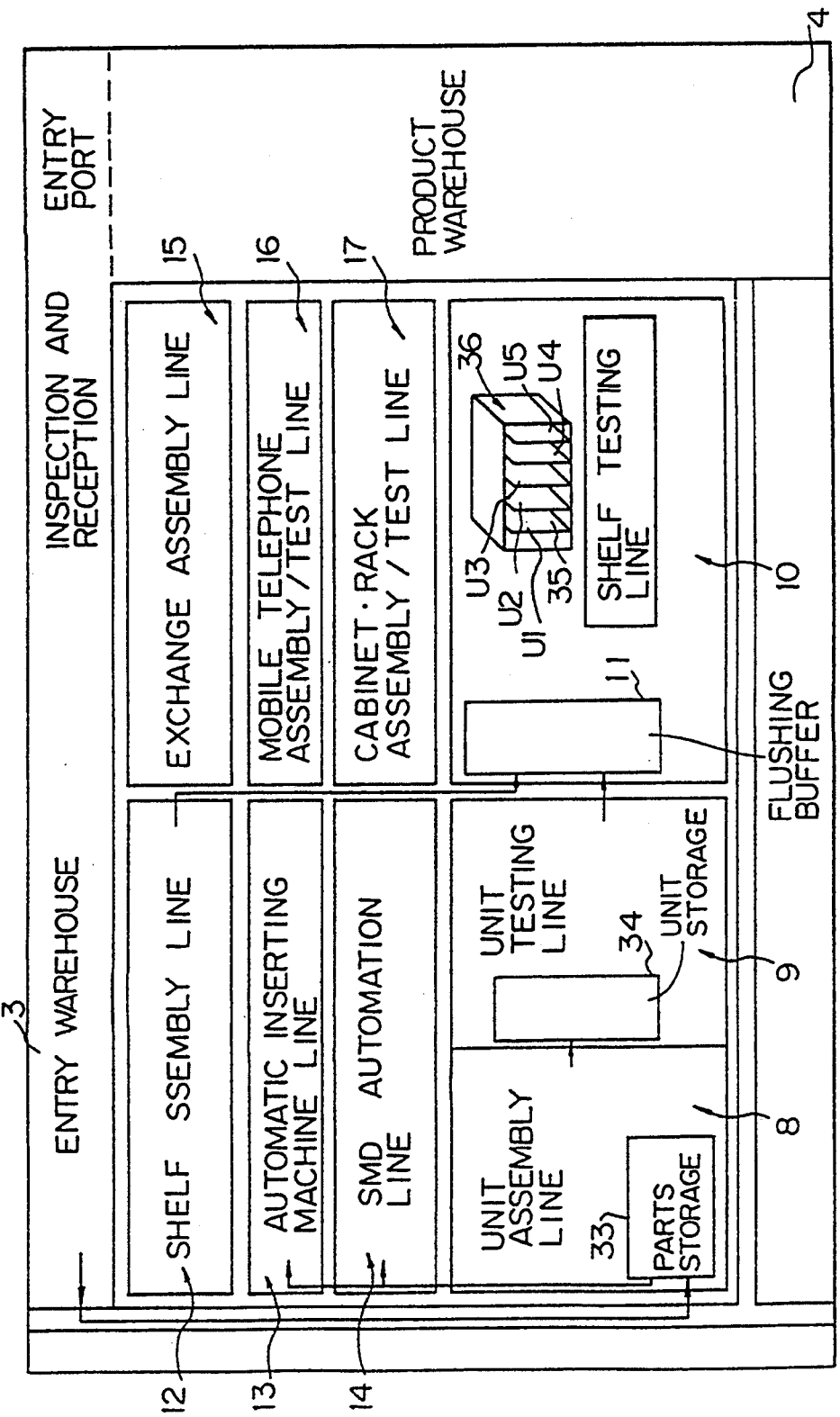
FIG. 13 is a schematic view explaining the synchronization of the flow of articles in accordance with the invention.

FIG. 13 is a view explaining the synchronization of the flow of articles. In the figure, reference numerals 3, 4, 8, 9, 10, 12, 13, 14 15, 16 and 17 correspond to those shown in FIG. 2. Reference numeral 11 corresponds to the same item in FIG. 1E and FIG. 2, i.e., the flushing buffer. Reference numeral 33 denotes a parts storage, 34 a unit storage, 35 a unit (U1 to U5 as an example), 36 a shelf (SH).

As explained above with reference to FIG. 12, note is taken to minimize an accumulation of goods in process at respective lines and at each stage. However, for lines, such as the production line arranging a variety of materials, an adjustment of the workload is required and thus it is desired for each of the lines to have, at respective entry ports, so-called intermediate buffer portions. The intermediate buffer portions correspond, in FIG. 13, to the flushing buffer 11, the parts storage 33 and the unit storage 34.

The shelf testing line 10, as mentioned before, is supplied with the units (U) 35 that have passed the test at the unit testing line 9 and with the shelves 36 that have been assembled at the shelf assembly line 12. The necessary units 35 are loaded on the shelf 36 as shown by U1, U2, U3 . . . in FIG. 13. The categories of the thus loaded units differ according to the attributes of the shelf 36, and therefore, it is necessary to gather all the units 35 to be loaded on respective shelves 36 only. Further, in the shelf testing line 10, a plurality of separate testing lines exist, making the test end times of respective testing lines different.

Under the above circumstances, in order to achieve the shelf test efficiently, it is preferable to synchronize, at the entrance of the shelf testing line 10, the availability of the units 35 from the unit testing line 9 and the availability of the shelf 36 from the shelf assembly line 12. Accordingly, the units 35 and the shelves 36 to be entered are stored in the shown flushing buffer 11 and synchronized for use.

Further, in general, as explained before with reference to FIG. 10 and 11, the parts materials needed by the automatic inserting machine line 13 and the SMD automation line 14 are fed from the entry warehouse 3. However, when night work is required, it is not preferable to put the entry warehouse 3 in a state of full operation as is the case during the day. Therefore, in the present invention, the parts storage 33 is located at the entrance of the unit assembly line 8 so as to store therein parts materials to be used during the night. Namely, the parts materials to be used during the night can be fed from the parts storage 33 to the automatic inserting machine line 13 and the SMD automation line 14.

Further, also in the unit testing line 9, a plurality of testing lines are operated parallel to each other. Therefore in order to supply the units to teach testing line 10 efficiently (i.e., without accumulation), the unit storage 34 is located as shown in FIG. 13, such that some units to be tested are stored.

Figure 14:
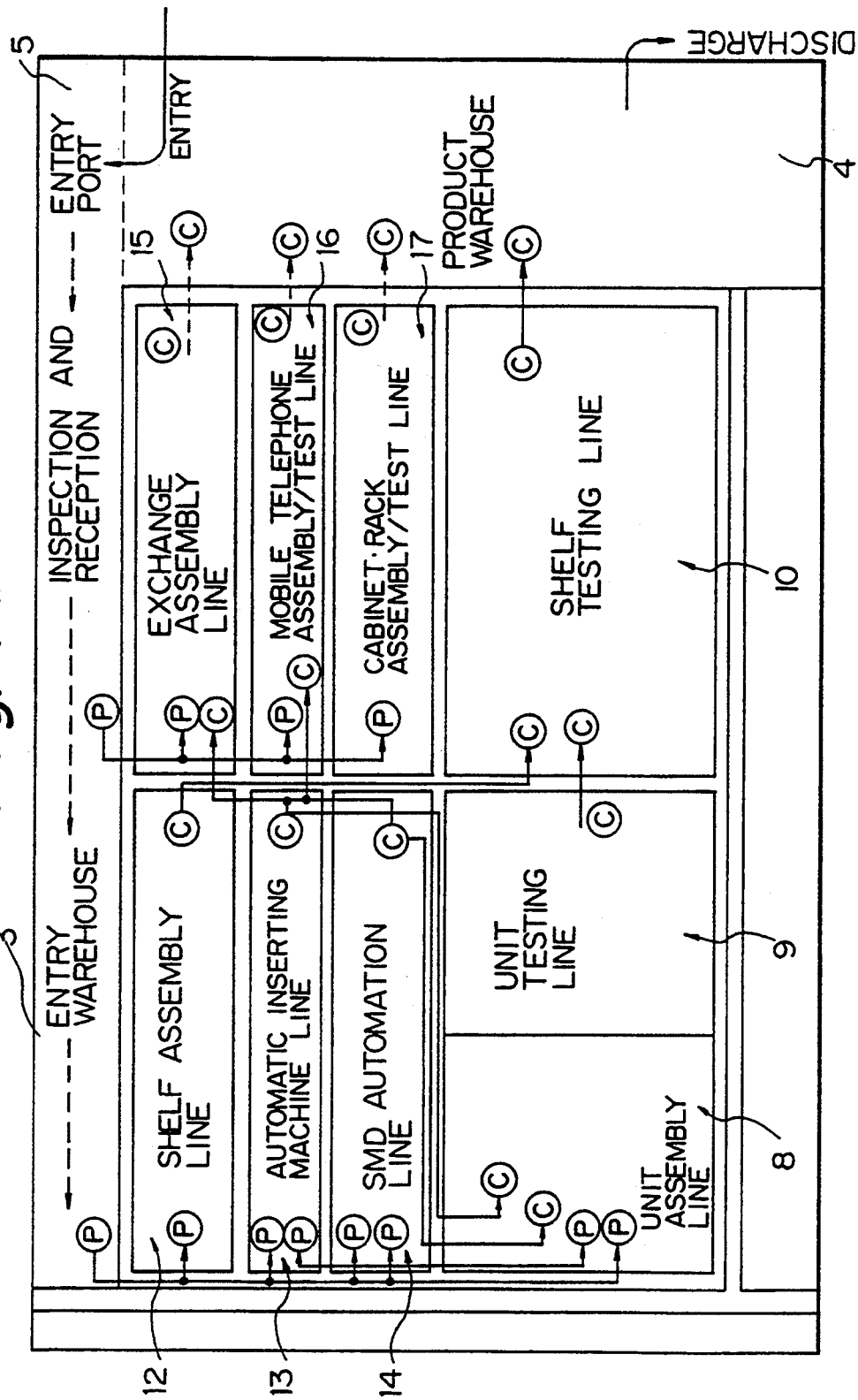
FIG. 14 is a schematic view for explaining the manner in which articles are transferred automatically in accordance with the invention.

FIG. 14 is a view for explaining that the articles are transferred automatically. In this figure, reference numerals 3, 4, 5, 8, 9, 10, 12, 13, 14, 15, 16 and 17 correspond to those shown in FIG. 2. In FIG. 14, the solid line arrow represents a stage where article transportation is achieved mainly by the use of the self-propelled cart, an the broken line arrow represents a state where article transportation is achieved mainly by the use of the conveyor. Note, in the figure, that the symbol P enclosed by a circle denotes origin and destination of transfer of the parts and the symbol C enclosed by a circle denotes origin and destination of transfer of the completed article.

The shelf assembly line 12 receives parts from the entry warehouse 3 and then supplies the completed articles to the shelf testing line 10. The automatic inserting machine line 13 receives the parts from the entry warehouse 3 or the aforesaid parts storage 33 in the unit assembly line 8 and then supplies the completed articles to the unit assembly line 8 or the exchange assembly line 15 and the mobile telephone assembly/test line 16. The SMD automation line 14, as in the case of the aforementioned automatic inserting machine line 13, receives the parts from the entry warehouse 3 or the parts storage 33 in the unit assembly line 8 and supplies the completed articles to the unit assembly line 8, the exchange assembly line 15 or the mobile telephone assembly/test line 16.

The unit assembly line 8 receives the parts from the parts storage 33 from the entry warehouse 3 and supplies the same to the automatic inserting machine line 13 and the SMD automation line 14. While, except in special cases of parts storage 33, the unit assembly line 8 receives the completed articles such as the printed circuit boards and so on from the automatic inserting machine line 13 and the SMD automation line 14 to assemble them into units. Then the assembled units are fed, via the unit testing line 9, to the shelf testing line 10.

The exchange assembly line 15 receives the parts from the entry warehouse 3 and also receives the completed articles such as the printed circuit boards and so on from the automatic inserting machine line 13 and the SMD automation line 14 to assemble the exchanges that are then stored in the product warehouse 4.

The mobile telephone assembly/test line 16 receives the parts from the entry warehouse 3 and also receives the completed articles such as the printed circuit boards and so on from the automatic inserting machine line 13 and the SMD automation line 14 to assemble the mobile telephones and the hand-held telephones that are then stored in the product warehouse 4.

The cabinet.rack assembly/test line 17 receives the parts from the entry warehouse 3 to assemble the cabinets and the racks that are then stored in the product warehouse 4.

The shelf testing line 10 receives the tested unit from the unit testing line 9 and the shelf from the shelf assembly line 12 and conducts the shelf test with respect to each shelf mounting thereon the necessary units as shown by the units 35 and the shelves 36 in FIG. 13, that are stored in the product warehouse 4. The variety of products stored in the product warehouse 4 are discharged by the use of trucks.

Although it is difficult to express on the drawings, the present invention includes an idea for making changes in the layout so as to easily cope with changes of the layout in the future. Namely, regarding the lines 8, 9, 10, 12, 13, 14, 15, 16 and 17 in FIG. 2, the following measures are taken.

(A) a plurality of electric power panels are uniformly distributed in the floor 100 and the electric power panels are designed substantially the same.
  (B) main pipe line of pressure gas (air) is distributed substantially uniformly in the whole area of the floor 100, and thereby gas pressure is available at any location, and
  (C) the zone of the assembly lines and the zone of the testing lines are roughly determined, and air conditioners are permanently arranged to account for the heat radiated from respective zones.

Further, in the present invention, building block methods are employed for each line, requiring no movement of the existing equipment even in the case of figure extension and expansion. It is sufficient to merely add components corresponding to the extension. Further, if each of the lines, for example, line A and line B, exist parallel to each other, equipment is arranged so that lines A and B can commonly use the equipment.

Further, the transportation routes are designed such that the aforesaid self-propelled carts and the conveyors can operate effectively, and automation unmanned is used as much as possible by utilizing the floor control system 20 shown in FIG. 8A.

As explained above, the present invention applies the following (i), (ii) and (iii), which have not been conceived of in prior art, to a floor that is substantially flat and rectangular
  (i) the L-shaped warehouse area and the substantially rectangular line equipment,
  (ii) the E-shaped flow of the articles,
  (iii) the duplex L-shaped material transportation mode (L1, L2) taking note of movement of heavy weight and large size articles.

Thus, it is possible to effectively design the variety product manufacturing equipment for the floor.

Further, by utilizing the self-propelled carts and the conveyors effectively, an accumulation of goods is minimized and it is possible to synchronize, in cooperation, the article flow on the lines by employing the flushing buffer, if necessary.

We claim:

1. A variety product manufacturing facility comprising:
    rectangular floor having four sides;
    an entry warehouse area located on said floor along a first side thereof;
    a product warehouse area located on said floor along a second side thereof adjacent to said first side so as to form a substantially L-shaped warehouse with the entry warehouse area, said entry warehouse area including an entry port located adjacent said product warehouse area;
    a line equipment area located on the remainder of said floor, said line equipment area being formed of a plurality of parts assembly lines and a plurality of dedicated product assembly lines, said parts assembly lines being located along a third side of the floor opposite to said second side thereof, and said dedicated product assembly lines being located between the parts assembly lines and said product warehouse area; and
    transportation means for carrying articles from said entry port of said entry warehouse to said product warehouse through said parts assembly lines and said dedicated product assembly lines, in the stated order, in an E-shaped flow pattern of articles, and discharging completed articles from said product warehouse,
    said dedicated product assembly lines being constructed such that the respective functions thereof are independent from each other, and said parts assembly lines being constructed such that the respective functions thereof are cooperable with each other so as to produce articles commonly required by said dedicated assembly lines.

2. A variety product manufacturing facility comprising:
    a rectangular floor having four sides;
    an entry warehouse area located on said floor along a first side thereof;
    a product warehouse area located on said floor along a second side thereof adjacent to said first side so as to form a substantially L-shaped warehouse with the entry warehouse area, said entry warehouse area including an entry port located adjacent said product warehouse area;
    a line equipment area located on the remainder of said floor, said line equipment area being formed of a plurality of parts assembly lines and a plurality of dedicated product assembly lines, said parts assembly lines being located along a third side of the floor opposite to said second side thereof, and said dedicated product assembly lines being located between the parts assembly lines and said product warehouse area; and
    transportation means for carrying articles from said entry port of said entry warehouse to said product warehouse through said parts assembly lines and said dedicated product assembly lines, in the stated order, in an E-shaped flow pattern of articles, and discharging completed articles from said product warehouse,
    said transportation means including a first transportation line along said third side which carries the articles from said entry warehouse to said parts assembly lines,
    said transportation means including a second transportation line extending between said parts assembly lines and said dedicated product assembly lines from said entry warehouse to a fourth side of the floor opposite to said first side thereof to carry articles from said entry warehouse to said dedicated product assembly lines.

3. A facility as set forth in claim 2, wherein said dedicated product assembly lines are arranged in parallel to said first side of the floor and such that those dedicated product assembly lines which are fed a greater amount of articles from said entry warehouse are positioned closer to said entry warehouse than those dedicated product assembly lines which are fed lesser amounts of articles.

4. A facility as set forth in claim 2, wherein one of said parts assembly lines is a unit assembly/test line which includes a unit assembly segment and an assembled unit testing segment.

5. A facility as set forth in claim 4, wherein a second parts assembly line is used for assembling shelves, and one of said dedicated product assembly lines is a shelf insertion and testing line for receiving assembled shelves from the second parts assembly line and tested units from said unit assembly/test line, inserting the tested units into respective shelves, testing the shelves containing the tested units, and feeding the tested shelves to said product warehouse.

6. A facility as set forth in claim 5, wherein a flushing buffer is located at the entry side of said shelf insertion and testing line to momentarily store therein both the tested units and the assembled shelves, so that the units and shelves may be fed to the shelf insertion and testing line in a synchronized manner.

7. A facility as set forth in claim 5, wherein one of said dedicated product assembly lines is a cabinet.rack assembly/test line for assembling cabinets and racks, inserting the tested unit containing shelves therein, testing the assembled cabinets and racks, and feeding the completed articles to said product warehouse.

8. A facility as set forth in claim 4, wherein at least two of said parts assembly lines are used for producing articles commonly required by said dedicated products assembly lines and by said unit assembly/test line.

9. A facility as set forth in claim 8, wherein said two of said parts assembly lines include an automatic inserting machine line and a surface mount device (SMD) automation line.

10. A facility as set forth in claim 4, wherein a parts storage is provided at the entry to the unit assembly segment and a unit storage is provided at the entry to the testing segment, for storing and buffering the given parts and units, respectively.

11. A facility as set forth in claim 2, wherein said transportation means includes conveyors and self-propelled carts, said conveyors being used for creating said E-shaped flow pattern of said articles, said self-propelled carts being used for carrying articles between lines which are not directly linked to said conveyors.

12. A facility as set forth in claim 11, wherein said conveyors and self-propelled carts are operated under control of a floor control system, a data processing system corresponding to a customer, a production management system, a CAD system, a warehouse management system handling entry and discharge management and a manufacturing management system, said systems forming a local area network (LAN) with the assembly lines.

13. A facility as set forth in claim 2, wherein a plurality of substantially identical electric power panels are uniformly distributed in said floor.

14. A facility as set forth in claim 2, wherein a main pressurized gas pipeline has outlets distributed substantially uniformly throughout the entire area of said floor.

15. A facility as set forth in claim 2, wherein each of said lines is constructed with building blocks to facilitate future extension and expansion thereof.

* * * * *

UNITED STATES PATENT AND TRADEMARK OFFICE
CERTIFICATE OF CORRECTION

PATENT NO. : 5,371,679
DATED : December 6, 1994
INVENTOR(S) : MASAHASHI ABE et al.

It is certified that error appears in the above-indentified patent and that said Letters Patent is hereby corrected as shown below:

Column 10, line 7, delete "an" and substitute --and--.

Signed and Sealed this

Twenty-eight Day of March, 1995

Attest:

BRUCE LEHMAN

Attesting Officer     Commissioner of Patents and Trademarks